(12) United States Patent
Shin et al.

(10) Patent No.: US 7,880,211 B2
(45) Date of Patent: Feb. 1, 2011

(54) ANTI-FUSE AND METHOD FOR FORMING THE SAME, UNIT CELL OF NONVOLATILE MEMORY DEVICE WITH THE SAME

(75) Inventors: Chang-Hee Shin, Chungcheongbuk-do (KR); Ki-Seok Cho, Chungcheongbuk-do (KR); Seong-Do Jeon, Chungcheongbuk-do (KR)

(73) Assignee: MagnaChip Semiconductor, Ltd. (KR)

( * ) Notice: Subject to any disclaimer, the term of this patent is extended or adjusted under 35 U.S.C. 154(b) by 0 days.

(21) Appl. No.: 12/379,094

(22) Filed: Feb. 12, 2009

(65) Prior Publication Data
US 2009/0206381 A1 Aug. 20, 2009

(30) Foreign Application Priority Data
Feb. 20, 2008 (KR) .................. 10-2008-0015153

(51) Int. Cl.
*H01L 27/108* (2006.01)
(52) U.S. Cl. ............... 257/300; 257/530; 257/E23.147
(58) Field of Classification Search .................. 257/300, 257/530, E23.147
See application file for complete search history.

(56) References Cited

U.S. PATENT DOCUMENTS

| 5,235,335 | A | * | 8/1993 | Hester et al. | ................. 341/172 |
| 7,402,855 | B2 | | 7/2008 | Kurjanowicz | |
| 7,642,138 | B2 | | 1/2010 | Kurjanowicz | |
| 2006/0244099 | A1 | | 11/2006 | Kurjanowicz | |
| 2006/0292754 | A1 | * | 12/2006 | Min et al. | .................... 438/131 |

FOREIGN PATENT DOCUMENTS

KR 20070010077 1/2007

* cited by examiner

*Primary Examiner*—Tan N Tran
(74) *Attorney, Agent, or Firm*—NSIP Law

(57) ABSTRACT

An anti-fuse includes a gate dielectric layer formed over a substrate, a gate electrode including a body portion and a plurality of protruding portions extending from the body portion, wherein the body portion and the protruding portions are formed to contact on the gate dielectric layer, and a junction region formed in a portion of the substrate exposed by sidewalls of the protruding portions.

17 Claims, 7 Drawing Sheets

ANTI-FUSE AND METHOD FOR FORMING THE SAME, UNIT CELL OF NONVOLATILE MEMORY DEVICE WITH THE SAME

CROSS-REFERENCE TO RELATED APPLICATIONS

The present invention claims priority of Korean patent application number 10-2008-0015153, filed on Feb. 20, 2008, which is incorporated by reference in its entirety.

BACKGROUND OF THE INVENTION

1. Field of the Invention

The present invention relates to a method for fabricating a semiconductor device and, more particularly, to a one-time programmable (OTP) unit cell of a nonvolatile memory device and a method for fabricating the same.

2. Description of Related Art

The OTP unit cell is used for a memory repair in a volatile or a nonvolatile memory device such as dynamic random access memory (DRAM), electrically erasable programmable read-only memory (EEPROM) and Flash. The OTP unit cell is also used for trimming an internal operation voltage or a frequency in a mixed-signal chip where an analog chip and a digital chip exist together.

In general, an OTP unit cell includes an anti-fuse consisting of a metal-oxide-semiconductor field effect transistor (MOSFET, hereafter, referred to as "MOS transistor") and one or more MOS transistors. The OTP unit cell is formed with a single type or an array type and used for repair or trimming.

FIG. 1 illustrates a cross-sectional view of a typical anti-fuse of an OTP unit cell. For convenience in description, a certain portion including the typical anti-fuse of the OTP unit cell is illustrated and other transistors consisting of other OTP unit cells are not illustrated.

Referring to FIG. 1, the typical anti-fuse of the OTP unit cell includes a substrate 100, a gate electrode 105 formed over the substrate 100 and a junction region 106, such as a source region and a drain region, formed in a portion of the substrate 100 exposed by sidewalls of the gate electrode 105. Furthermore, the typical anti-fuse further includes a gate dielectric layer 104 having a comparatively thin thickness formed between the gate electrode 105 and the substrate 100.

Writing operation of the typical OTP unit cell with the above described structure will be described hereafter.

The junction region 106 and a pick-up region 107 are interconnected and also connected with a VSS. The pick-up region 107 is used to apply a bias to a well 101. A writing voltage $V_{WR}$ is applied to the gate electrode 105 through a metal interconnection layer 108. Thus, a high field effect occurs between the gate electrode 105 and the substrate 100 and causes a breakdown of the gate dielectric layer 104. Therefore, the gate electrode 105 and the substrate 100 have a short-circuit.

However, the gate dielectric layer 104 of the typical anti-fuse of the OTP unit cell has a limitation in that it is not stably broken-down by the applied writing voltage.

During the writing operation, the writing voltage $V_{WR}$ transferred to the gate electrode 105 through the metal interconnection layer 108 has a descent voltage by a sheet resistance $R_S$ caused by the metal interconnection layer 108 and the descent writing voltage $V_{WR}$ is applied to the gate electrode 105. Therefore, since the field-effect between the gate electrode 105 and the substrate 100 is decreased as much as the descent voltage, the gate dielectric layer 104 is not stably broken-down.

Furthermore, during the initial period of the writing operation, the gate dielectric layer 104 is partially broken-down and the gate electrode 105 and the substrate 100 are partially short-circuited. In this case, there is a problem in that, a high field effect is not formed continuously between the gate electrode 105 and the substrate 100 due to a leakage current between the well 101 and a channel stop region 102. The partial break-down represents a state that the gate dielectric layer 104 is not broken-down as much as target level.

For example, when the well 101 is a P-well as shown in FIG. 1, the channel stop region 102 is doped with N-type impurity. Thus, a forward diode is formed between the well 101 and the channel stop region 102. Therefore, when the gate electrode 105 and the substrate 100 are partially shorted due to partial break-down of the gate dielectric layer 104, the forward diode operates and a leakage current is caused.

When a leakage current is caused between the well 101 and the channel stop region 102, it is hard to cause a stable breakdown of the gate dielectric layer 104 as much as a target level. Thus, the device malfunctions since a sensing margin of data is decreased during a read operation. Such malfunction decreases reliability of the reading operation of the OTP unit cell.

SUMMARY OF THE INVENTION

Embodiments of the present invention are directed to an anti-fuse, a fabrication method thereof, which is capable of improving a operation reliability by causing a stable breakdown of a gate dielectric layer of the anti-fuse including a metal-oxide semiconductor (MOS) transistor to improve a data sensing margin during a reading operation and a unit cell of a nonvolatile memory device with the same.

In accordance with an aspect of the present invention, there is provided an anti-fuse. The anti-fuse includes a gate dielectric layer formed over a substrate, a gate electrode including a body portion and at least one protruding portions extending from the body portion, wherein the body portion and the protruding portions are formed to contact on the gate dielectric layer, and a junction region formed in a portion of the substrate exposed by sidewalls of the protruding portions.

In accordance with another aspect of the present invention, there is provided an anti-fuse. The anti-fuse includes a metal-oxide-semiconductor field effect transistor (MOS transistor), and a compensation capacitor contacting the MOS transistor in parallel.

In accordance with another aspect of the present invention, there is provided a unit cell of a nonvolatile memory device including an anti-fuse. The anti-fuse includes a gate dielectric layer formed over a substrate, a gate electrode including a body portion and at least one protruding portions extending from the body portion, wherein the body portion and the protruding portions are formed to contact on the gate dielectric layer, and a junction region formed in a portion of the substrate exposed by sidewalls of the protruding portions.

In accordance with another aspect of the present invention, there is provided a unit cell of a nonvolatile memory device including an anti-fuse. The anti-fuse includes a metal-oxide-semiconductor field effect transistor (MOS transistor), and a compensation capacitor contacting the MOS transistor in parallel, wherein the compensation capacitor includes a first electrode contacting a gate electrode of the MOS transistor, a second electrode contacting a junction region of the MOS transistor, and a first dielectric layer formed between the first and second electrodes, wherein the gate electrode and the first electrode comprise a metal material or a poly-crystal silicon layer.

In accordance with another aspect of the present invention, there is provided a method for fabricating an anti-fuse. The method includes forming a gate dielectric layer over a substrate, forming a gate electrode including a body portion and at least one protruding portions extending from the body portion over the gate dielectric layer, and forming a junction region in a portion of the substrate exposed by sidewalls of the protruding portions.

DESCRIPTION OF SPECIFIC EMBODIMENTS

Figure 1:
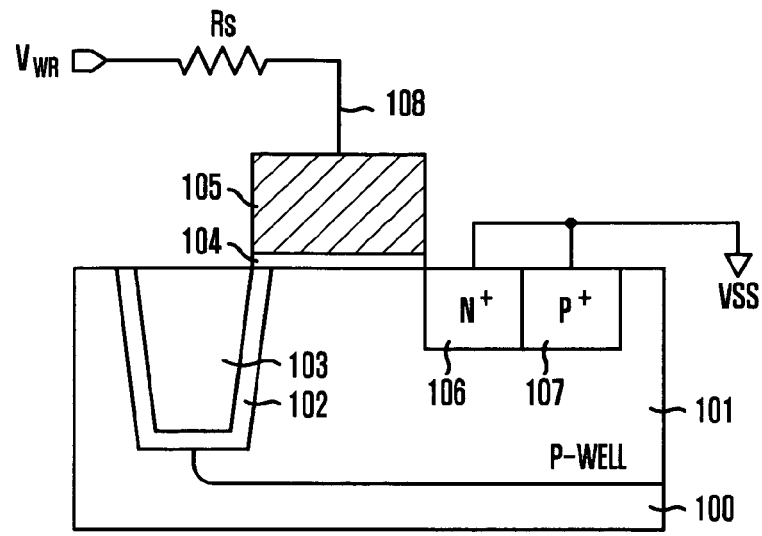
FIG. 1 illustrates a cross-sectional view of a typical anti-fuse of an OTP unit cell.

In the figures, the dimensions of layers and regions are exaggerated for clarity of illustration. It will also be understood that when a layer is referred to as being "on/under" another layer or substrate, it can be directly on/under the other layer or substrate, or intervening layers may also be present. Likewise, when a layer is referred to as being 'between' two layers, it can be the only layer between the two layers, or one or more intervening layers may also be present. Like reference numerals refer to like elements throughout the drawings. In addition, different English alphabetical characters following a reference numeral of a layer refer to different states of the layer after one or more processing steps, such as an etch process or a polishing process.

Hereafter, preferred embodiments of the present invention will be described in detail with reference to the accompanying drawings.

Figure 2:
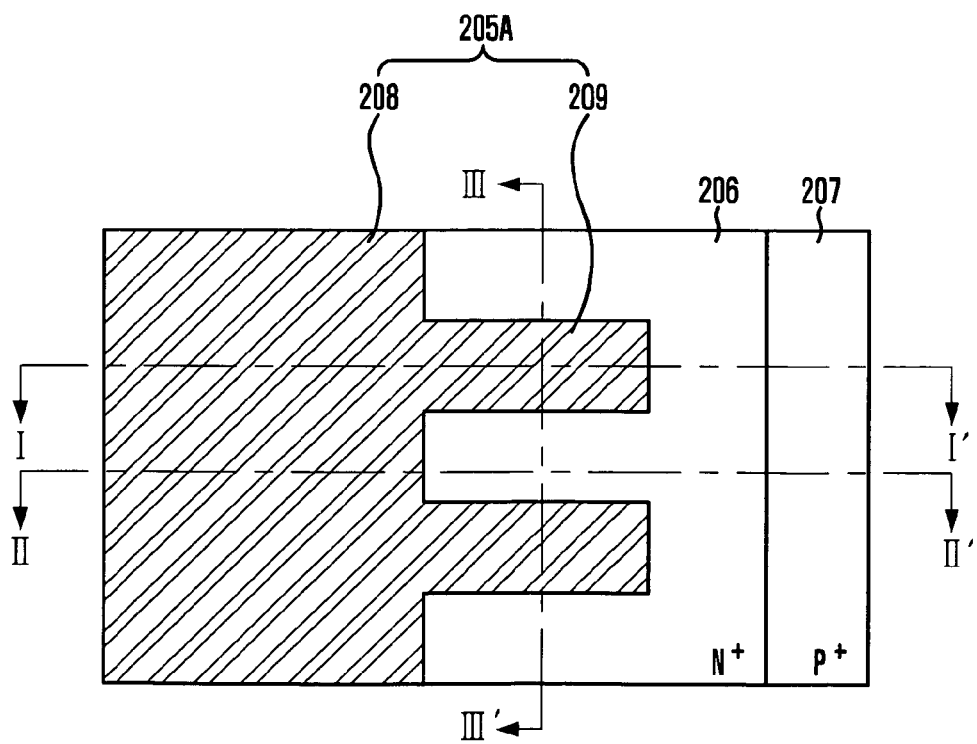
FIG. 2 is a plan view of an anti-fuse of a unit cell of a nonvolatile memory device in accordance with an embodiment of the present invention.
Figure 3:
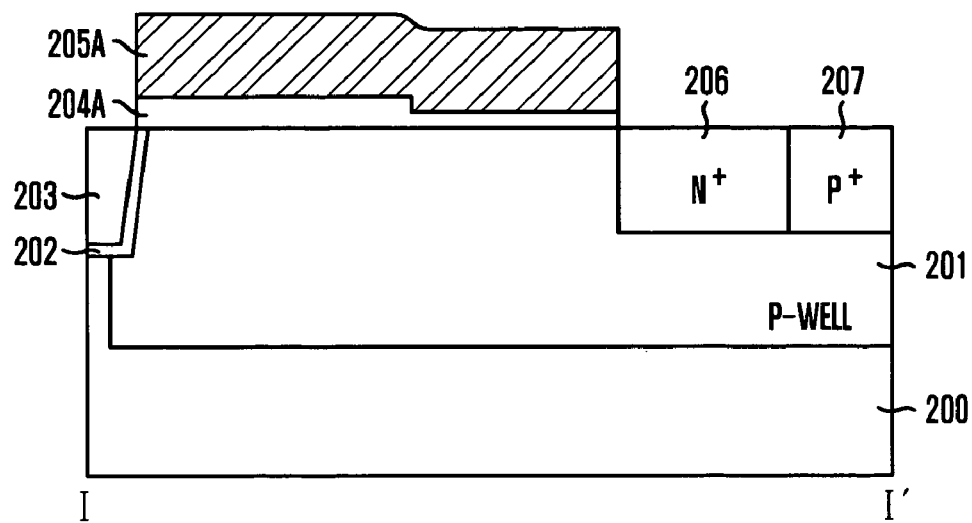
FIG. 3 illustrates a cross-sectional view taken along a line I-I' of FIG. 2.
Figure 4:
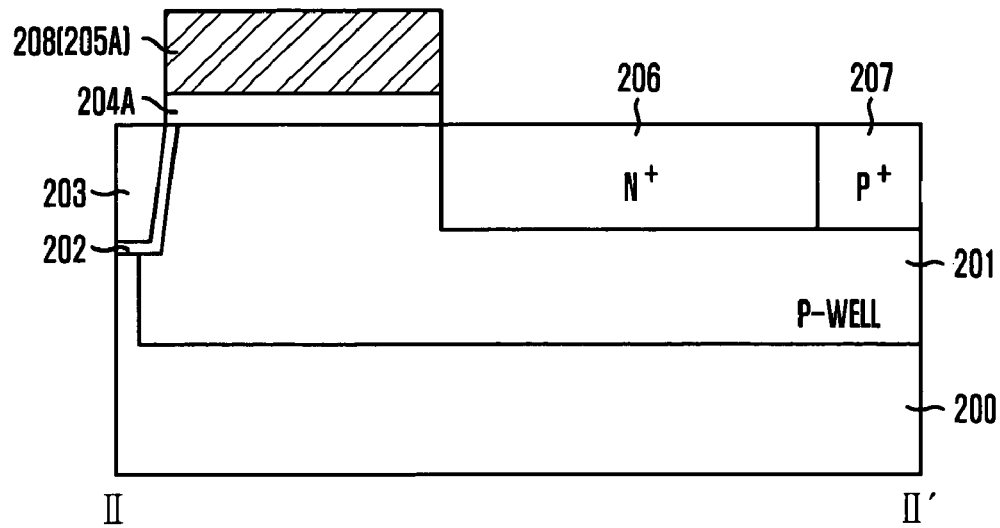
FIG. 4 illustrates a cross-sectional view taken along a line II-II' of FIG. 2.
Figure 5:
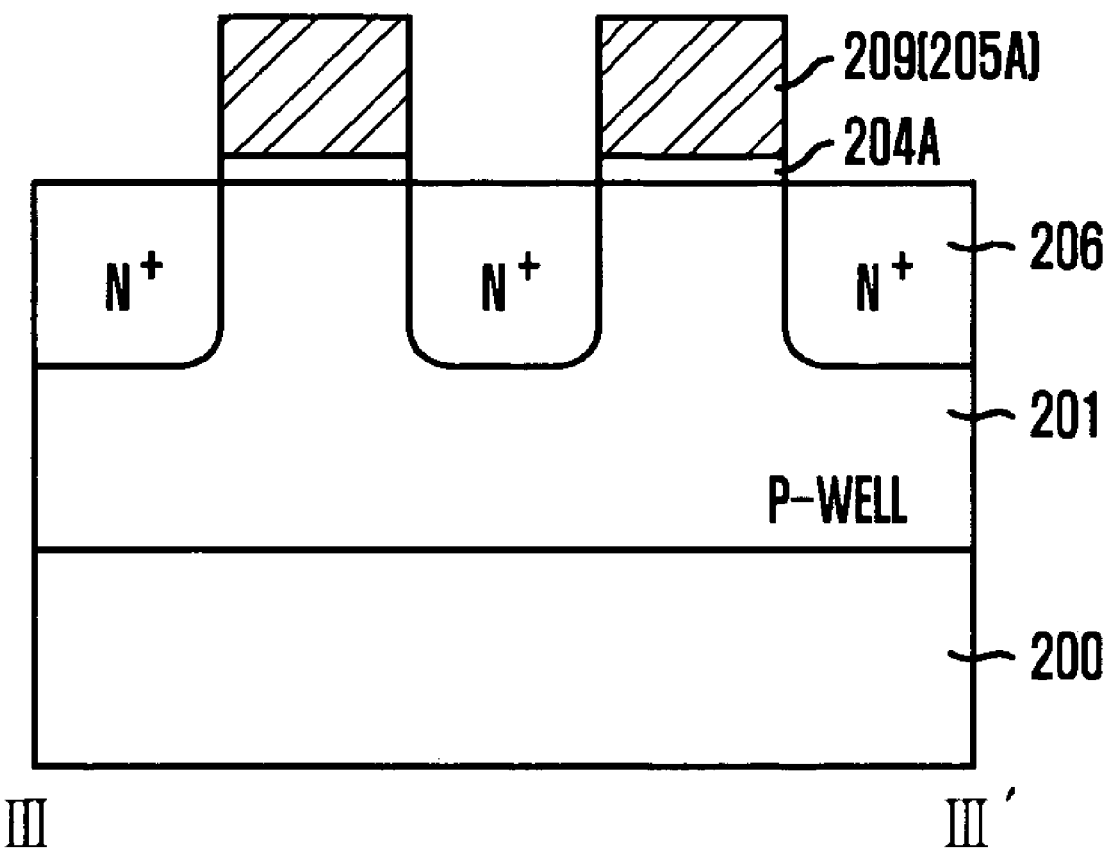
FIG. 5 illustrates a cross-sectional view taken along a line III-III' of FIG. 2.

FIG. 2 is a plan view of an anti-fuse of a unit cell of a nonvolatile memory device in accordance with an embodiment of the present invention. FIG. 3 illustrates a cross-sectional view taken along a line I-I' of FIG. 2, FIG. 4 illustrates a cross-sectional view taken along a line II-II' of FIG. 2, and FIG. 5 illustrates a cross-sectional view taken along a line III-III' of FIG. 2.

Referring to FIGS. 2 to 5, the anti-fuse of the unit cell of the nonvolatile memory device in accordance with the embodiment of the present invention includes a gate electrode 205A including a body portion 208 and a plurality of protruding portions 209 extending from the body portion 208. The anti-fuse further includes a gate dielectric layer 204A formed between the gate electrode 205A and a substrate 200. The anti-fuse further includes a junction region 206, such as a source region and a drain region, formed in a portion of the substrate 200 exposed by sidewalls of the protruding portions 209.

The body portion 208 and the protruding portions 209 of the gate electrode 205A are formed over the gate dielectric layer 204A in order to contact the gate dielectric layer 204A. It is possible that one or a plurality of the protruding portions 209 may be formed on each side, four sides in total. However, it is desirable that the protruding portions 209 are formed in parallel to each other by being extended from one side in order to simplify the fabricating method. That is, the protruding portions are extended from one side of the body portion in the same direction. Herein, "extend" includes a structure formed in a single body type as the protruding portions 209 are part the body portion 208, and a structure electrically contacting the body portion 208 although the protruding portions 209 are formed by using a different material from a material forming the body portion 208. Furthermore, the body portion 208 and the protruding portions 209 are formed to be overlapped in an active region of the substrate 200. The number, a width which means the length in the minor axis and a length which means the length in the major axis of the protruding portions 209 are not limitative, and may be properly selected according to a level of preset writing voltage and thickness of the gate dielectric layer 204A.

The gate dielectric layer 204A includes a first dielectric layer formed in a portion overlapped with the body portion 208 and a second dielectric layer formed in a portion overlapped with the protruding portions 209. The first and the second dielectric layers may be formed to have a height difference. It is desirable that the first dielectric layer has a thickness greater than that of the second dielectric layer. Herein, the thickness of the second dielectric layer may be selected in a range of approximately one third to approximately a half of the thickness of the first dielectric layer, according to the level of the writing voltage. Moreover, the first and the second dielectric layers may be formed to have a single body type structure by using the same material or may be formed by using difference materials.

The junction region 206 may include an impurity lightly-doped region and an impurity highly-doped region, wherein the highly impurity doped region may be formed in the lightly impurity doped region. The highly impurity doped region causes an ohmic contact between the junction region 206 and a contact plug (now shown).

Hereafter, referring to FIGS. 6A to 7, operation characteristics of an anti-fuse during a writing operation of a unit cell of a nonvolatile memory device in accordance with an embodiment of the present invention will be described.

Figure 6A:
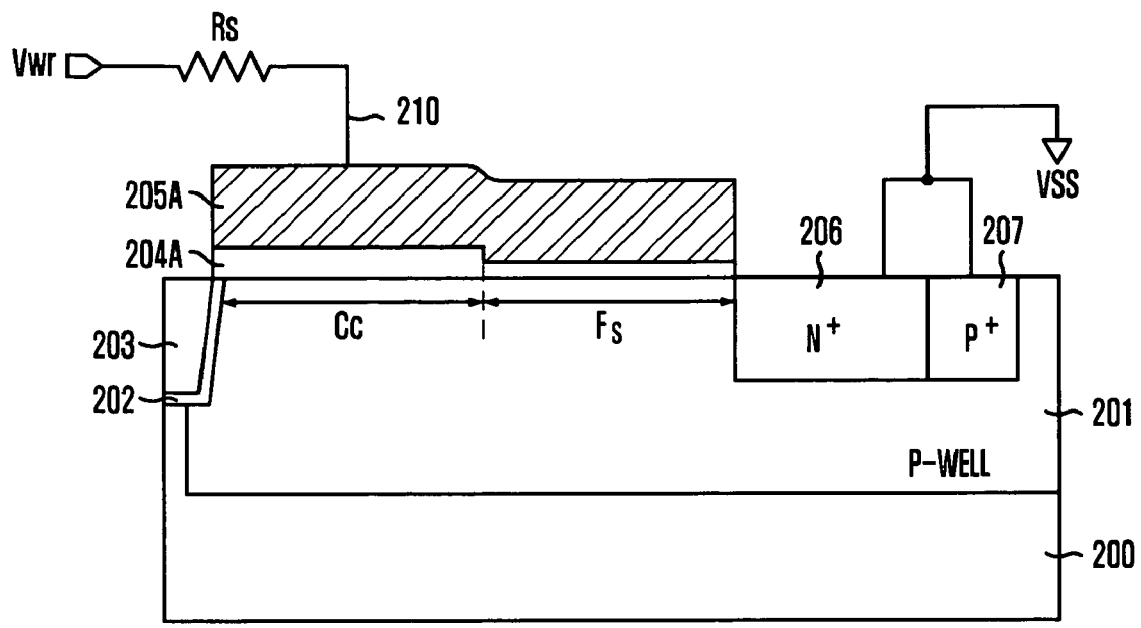
FIG. 6A is a cross-sectional view describing operation characteristics of the anti-fuse in accordance with an embodiment of the present invention.
Figure 6B:
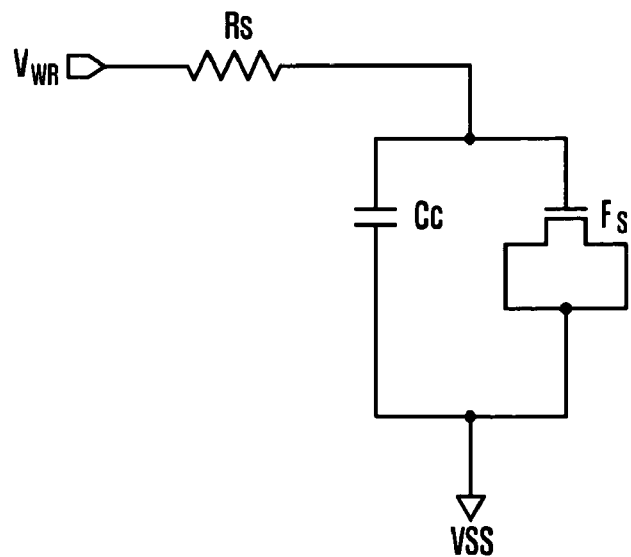
FIG. 6B is a detailed circuit diagram describing operation characteristics of the anti-fuse in accordance with the embodiment of the present invention.

FIG. 6A illustrates a cross-sectional view taken along a line II-II' of FIG. 2, and FIG. 6B is a detailed circuit diagram of the same. Herein, for instance, the anti-fuse includes a MOS transistor with n-channel.

Referring to FIGS. 6A and 6B, two capacitors exist in the anti-fuse. One of the capacitors may be used as a fuse $F_S$ since the capacitor is broken-down by a writing voltage $V_{WR}$, and the other capacitor may be used as a compensation capacitor $C_C$ which is not broken-down by the writing voltage $V_{WR}$ and accumulates electric charges.

The junction region 206 and a pick-up region 207 are interconnected to each other and also connected to a VSS. The writing voltage $V_{WR}$ is applied to the gate electrode 205A and a writing operation of the unit cell is performed. During the initial period of the writing operation, the writing voltage $V_{WR}$ is accumulated in the compensation capacitor $C_C$. When a dielectric layer of the fuse $F_S$, which is the second dielectric layer, is broken-down, the compensation capacitor $C_C$ compensates for the descent writing voltage $V_{WR}$ caused by a sheet resistance $R_S$ of the metal interconnection layer 210 in the chip. That is, a voltage pumping effect can be acquired by using the electric charges accumulated in the compensation capacitor $C_C$.

A high-voltage equal to or greater than the writing voltage $V_{WR}$ can be continuously applied to the second dielectric layer of the fuse $F_S$ by using the voltage pumping effect of the compensation capacitor $C_C$. The high-voltage can stably breakdown the second dielectric layer by continuously maintaining generation of a high field effect between the gate electrode 205A, which is the protruding portions 209 of FIG. 2, and the substrate 200.

Hereafter, a method for fabricating the anti-fuse of the unit cell of the nonvolatile memory device in accordance with an embodiment of the present invention will be described.

FIGS. 7A to 7F are cross-sectional views describing a fabricating process taken along a line II-II' of FIG. 2.

Figure 7A:
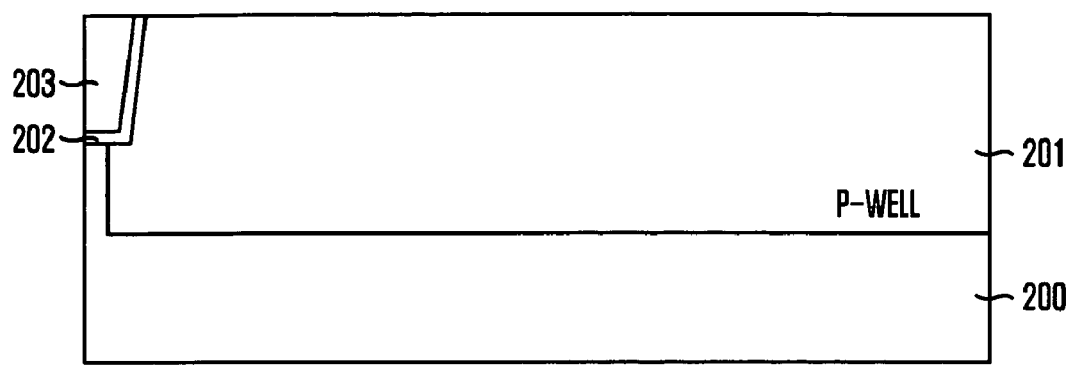
FIGS. 7A to 7F are cross-sectional views describing a method for fabricating the anti-fuse in accordance with the embodiment of the present invention.

Referring to FIG. 7A, the well 201 is formed in the substrate 200. Herein, the substrate 200 includes a semiconductor substrate and may include a bulk substrate or a silicon on insulator (SOI) substrate. A semiconductor layer of the substrate 200 may include one selected from the group consisting of Si, Ge, SiGe, GaP, GaAs, SiC, SiGeC, InAs and InP.

A trench (not shown) is formed in a portion of the substrate 200 and an ion implantation process is performed to form a channel stop region 202 in an inner surface of the trench. Herein, the channel stop region 202 is formed to have a different impurity type, such as a P-type impurity or an N-type impurity, from the well 201. For example, when the well 201 is formed by using a P-type impurity, the channel stop region 202 is formed by using N-type impurity.

An isolation layer 203 is formed by forming an insulation layer filling the trench. Thus, an active region and a non-active region (filed region) are defined on the substrate 200. Herein, the isolation layer 203 may be formed by using high density plasma (HDP)-undoped silicate glass (USG) layer having a good filling characteristic by a chemical vapor deposition (CVD) method.

Figure 7B:
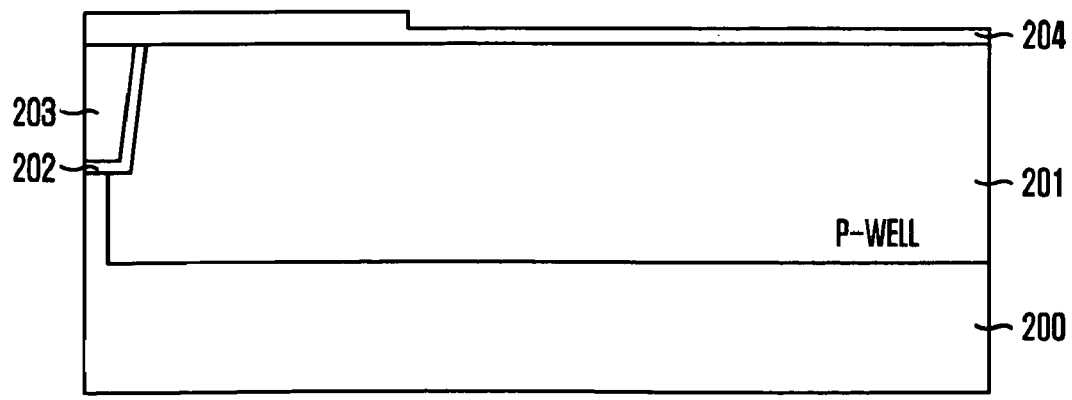

Referring to FIG. 7B, a dielectric layer 204 having different thicknesses is formed over the substrate 200. The dielectric layer 204 is used for a gate dielectric layer. The gate dielectric layer 204 may be formed by using an oxidation method having an excellent layer quality. The oxidation method may include one selected from the group consisting of a dry oxidation process, a wet oxidation process and an oxidation process using a radical ion. The gate dielectric layer may include one selected from the group consisting of an oxide layer, a nitride layer, an oxynitride layer, a metal oxide layer and a combination thereof.

To be specific, the gate dielectric layer 204 may be formed by using three different methods to be described hereafter.

Firstly, the first dielectric layer is formed over the substrate 200. Photoresist patterns (not shown) exposing a portion overlapped with the protruding portions 209 of the gate electrode 205A of FIG. 2, and the first dielectric layer exposed by the photoresist patterns are selectively removed through an etching process using the photoresist patterns as an etch mask. The second dielectric layer is formed over a portion from which the first dielectric layer is removed. Herein, the second dielectric layer may have a thickness thinner than that of the first dielectric layer. The first and the second dielectric layers may be formed by using an oxidation method.

Secondly, the first dielectric layer is formed over the substrate 200. Photoresist patterns (not shown) exposing a portion overlapped with the body portion 208 of the gate electrode 205A of FIG. 2, and the first dielectric layer exposed by the photoresist patterns are selectively removed through an etching process using the photoresist patterns as an etch mask. The second dielectric layer is formed over a portion from which the first dielectric layer is removed. Herein, the second dielectric layer may have a thickness thicker than that of the first dielectric layer. The first and the second dielectric layers may be formed by using an oxidation method.

Thirdly, the first dielectric layer is formed over the substrate 200. Photoresist patterns (not shown) exposing a portion overlapped with the body portion 208 of the gate electrode 205A of FIG. 2. The second dielectric layer is formed over the photoresist patterns and the first dielectric layer while the photoresist patterns cover the portion overlapped with the protruding portions 209. The second dielectric layer formed over the photoresist patterns is selectively removed as the photoresist patterns are removed. The method for selectively removing the second dielectric layer is called a lift-off method. Thus, the first and the second dielectric layers are formed on the portion overlapped with the body portion 208, and the first dielectric layer is merely formed on the portion overlapped with the protruding portion 209. Herein, the first dielectric layer and the second dielectric layer may have the same thickness.

Figure 7C:
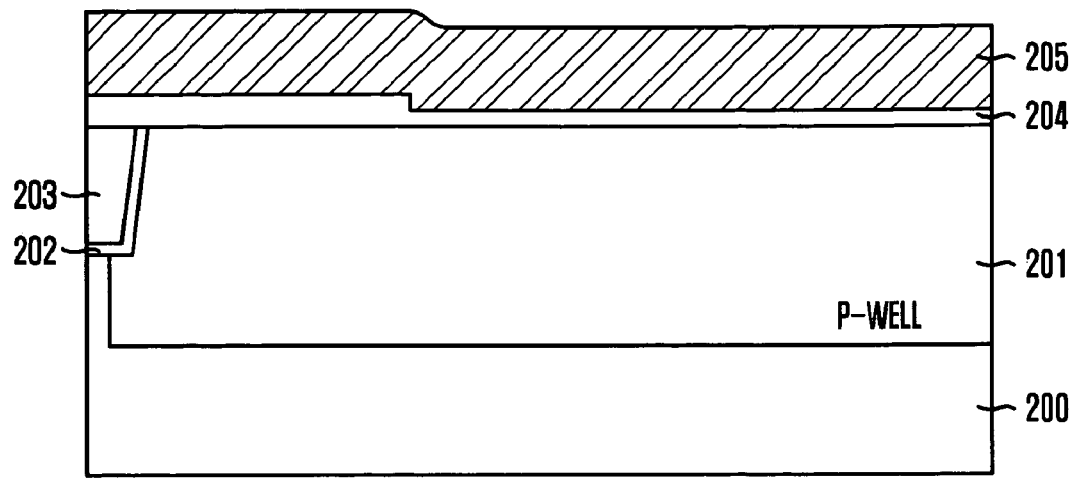

Referring to FIG. 7C, a conductive layer 205 is formed over the gate dielectric layer 204. The conductive layer 205 is used for a gate electrode. The conductive layer 205 may include a transition metal, a semiconductor material, a compound containing a transition metal and a transition metal oxide. To be specific, one selected from the group consisting of Sc, Ti, V, Cr, Mn, Fe, Co, Ni, Cu, Zn, Y, Zr, Nb, Mo, Tc, Ru, Rh, Pd, Ag, Cd, La, Hf, Ta, W, Fe, Os, Ir, Pt, Au and Hg may be used as the transition metal. Semiconductor materials having a crystal structure are used as the semiconductor material. To be specific, one selected from the group consisting of Si, Ge, Sn, Se, Te, B, C including a diamond, P, B—C, B—P($BP_6$), B—Si, Si—C, Si—Ge, Si—Sn, Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, (Cu, Ag)(Al, Ga, In, Ti, Fe)$(S, Se, Te)_2$, $Si_3N_4$, $Ge_3N_4$, $Al_2O_3$, (Al, Ga, In)$_2$(S, Se, Te)$_3$, $Al_2CO$, and a combination thereof.

The compound containing the transition metal may include a compound containing Ni such as $LaNi_5$, $MnNi_3$ and $Mg_2Ni$, a compound containing Ti such as $TiMn_2$, $TiV_2$, TiFe, TiCo, TiVCr and TiVMn, a compound containing Li such as LiAl. In other words, the conductive layer 205 may be formed by using one selected from the compound containing the transition metal including the transition metal bonding with other materials or transition metals having a stable form. As for the transition metal oxide, a vanadium oxide such as $VO_2$, $V_2O_3$ and $V_2O_5$.

Figure 7D:
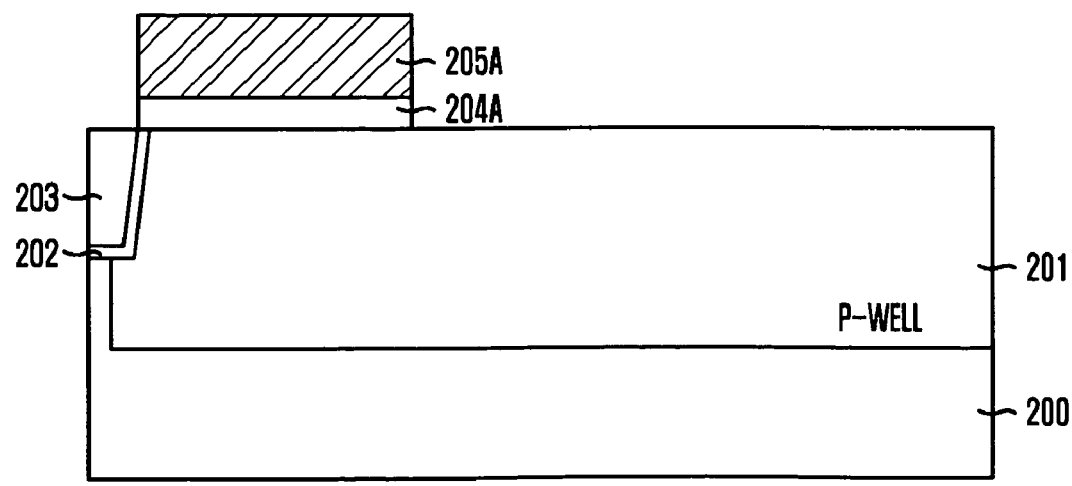

Referring to FIG. 7D, the gate electrode 205A having the body portion 208 and the plurality of the protruding portions 209, as shown in FIG. 2, is formed by etching the conductive layer 205. Herein, the etching process is performed by using a dry etching process, a wet etching process or both.

Although the gate dielectric layer 204 under the conductive layer 205 is also etched as shown in FIG. 7C during the etching of the conductive layer 205, the gate dielectric layer 204 under the conductive layer 205 may not be etched but remain.

Figure 7E:
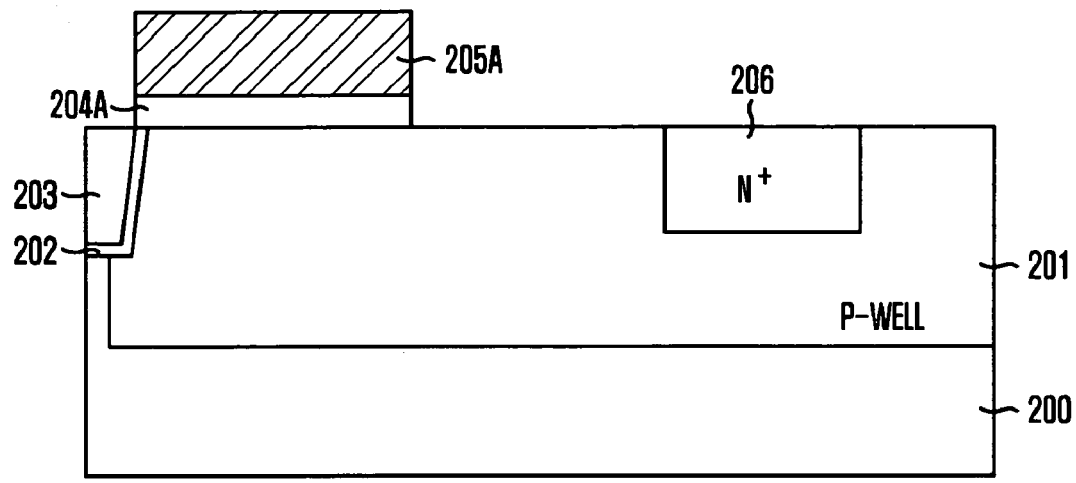

Referring to FIG. 7E, the junction region 206 is formed in a portion of the substrate 200 exposed by one side of the gate electrode 205A. The junction region 206 may include a lightly doped drain (LDD) region which is an impurity lightly-doped region. That is, the junction region 206 may include an impurity highly-doped region and the impurity lightly-doped region. For example, the lightly impurity doped region is formed in the substrate 200 and the highly impurity doped region is formed in the impurity lightly-doped region.

Figure 7F:
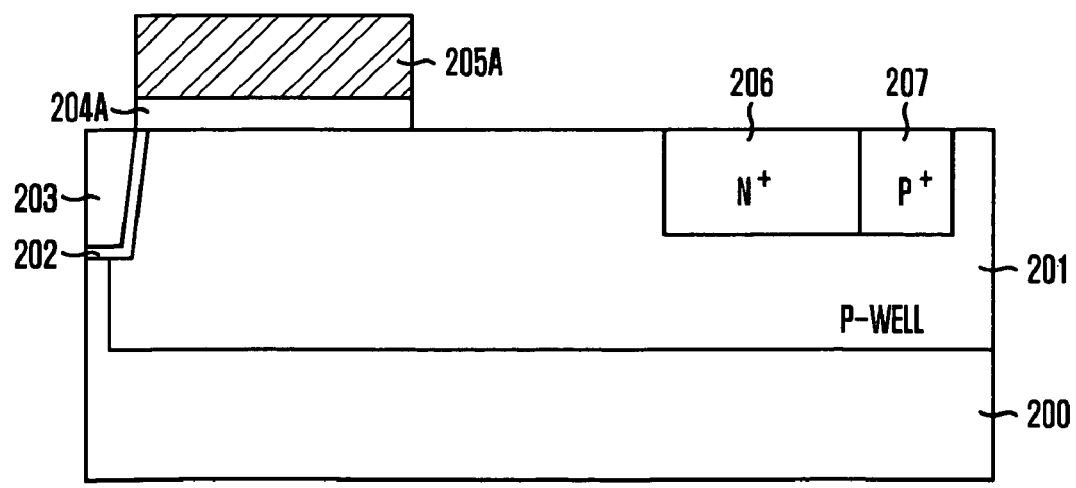

Referring to FIG. 7F, the pick-up region 207 is formed in the substrate 200 by performing an ion implantation process. The pick-up region 207 is formed to contact with the junction region 206.

Although it is not shown, contact plugs contact the gate electrode 205A, the junction region 206 and the pick-up region 207, respectively, and a metal interconnection layer contacting with the contact plugs are formed.

While the present invention has been described by taking the specific embodiments, it will be apparent to those skilled in the art that various changes and modifications may be made without departing from the spirit and scope of the invention as defined in the following claims.

In accordance with the present invention including above described structure, effects to be described hereafter can be accomplished.

Firstly, in accordance with the present invention, writing operation characteristics can be improved by terminating the writing operation when a gate electrode including a body portion and the plurality of the protruding portions is formed and a dielectric layer overlapped with one of a plurality of protruding portions is broken-down.

Secondly, in accordance with the present invention, stable writing operation can be realized by providing a compensation voltage, which is a descent voltage of the wiring voltage, through the compensation capacitor during the writing operation. Herein, the compensation voltage can be provided by forming a capacitor used as a fuse between the gate electrode and a substrate and the compensation capacitor, as a gate dielectric layer is formed to have different thicknesses according to a portion overlapped with the gate electrode.

What is claimed is:

1. An anti-fuse, comprising:
   a metal-oxide-semiconductor field effect transistor (MOS transistor) having a gate electrode, a junction region and a gate dielectric layer adjacent to the gate electrode, the gate dielectric layer being constructed and arranged to break down so that the MOS transistor becomes permanently conductive between the gate electrode and the junction region when a write voltage is applied between the gate electrode and the junction region; and
   a compensation capacitor coupled in parallel between the gate electrode and the junction region of the MOS transistor, the compensation capacitor being constructed and arranged to not break down in response to the write voltage, the compensation capacitor being constructed and arranged to maintain the write voltage across the gate electrode and the junction region as the breakdown of the gate dielectric layer of the MOS transistor begins to occur to cause breakdown to occur stably.

2. The anti-fuse of claim 1, wherein the compensation capacitor comprises:
   a capacitor electrode having a single body type structure with the gate electrode of the MOS transistor; and
   a capacitor dielectric layer formed adjacent to the capacitor electrode.

3. The anti-fuse of claim 2, wherein the capacitor dielectric layer has a thickness greater than a thickness of the gate dielectric layer.

4. The anti-fuse of claim 3, wherein the capacitor dielectric layer and the gate dielectric layer comprise one selected from the group consisting of an oxide layer, a nitride layer, an oxynitride layer, a metal oxide layer and any combination thereof.

5. The anti-fuse of claim 1, wherein the compensation capacitor comprises:
   a capacitor electrode contacting the gate electrode of the MOS transistor;
   a capacitor dielectric layer formed adjacent to the capacitor electrode.

6. The anti-fuse of claim 5, wherein the capacitor dielectric layer has a thickness greater than a thickness of the gate dielectric layer.

7. The anti-fuse of claim 5, wherein the capacitor electrode is formed of the same material used for forming the gate electrode.

8. The anti-fuse of claim 5, wherein the capacitor electrode is formed of a different material from a material forming the gate electrode.

9. The anti-fuse of claim 5, wherein the gate electrode and the capacitor electrode comprise a metal material or a poly-crystal silicon layer.

10. A unit cell of a nonvolatile memory device, comprising an anti-fuse which includes:
    a metal-oxide-semiconductor field effect transistor (MOS transistor) having a gate electrode, a junction region and a gate dielectric layer adjacent to the gate electrode, the gate dielectric layer being construction and arranged to break down so that the MOS transistor becomes permanently conductive between the gate electrode and the junction region when a write voltage is applied between the gate electrode and the junction region; and
    a compensation capacitor contacting the MOS transistor parallel to the gate electrode and the junction region, the compensation capacitor being constructed and arranged to not break down in response to the write voltage, the compensation capacitor being constructed and arranged to maintain the write voltage across the gate electrode and the junction region as the breakdown of the gate dielectric layer of the MOS transistor begins to occur to cause breakdown to occur stably,
    wherein the compensation capacitor includes a capacitor electrode contacting the gate electrode of the MOS transistor, and a capacitor dielectric layer formed adjacent to the capacitor electrode,
    wherein the gate electrode and the capacitor electrode comprise a metal material or a poly-crystal silicon layer.

11. An anti-fuse, comprising:
    a metal-oxide-semiconductor field effect transistor (MOS transistor) having a gate electrode, a junction region and a gate dielectric layer adjacent to the gate electrode, the gate dielectric layer having a uniform thickness; and
    a compensation capacitor coupled in parallel between the gate electrode and the junction region of the MOS transistor, the compensation capacitor having a capacitor dielectric layer having a thickness greater than the thickness of the gate dielectric layer.

12. The anti-fuse of claim 11, wherein the compensation capacitor comprises:
    a capacitor electrode, adjacent to the capacitor dielectric layer, and having a single body type structure with the gate electrode of the MOS transistor.

13. The anti-fuse of claim 11, wherein the compensation capacitor comprises:
a capacitor electrode adjacent to the capacitor dielectric layer and contacting the gate electrode of the MOS transistor.

14. The anti-fuse of claim 13, wherein the capacitor electrode is formed of the same material used for forming the gate electrode.

15. The anti-fuse of claim 13, wherein the capacitor electrode is formed of a different material from a material for forming the gate electrode.

16. The anti-fuse of claim 13, wherein the gate electrode and the capacitor electrode comprise a metal material or a poly-crystal silicon layer.

17. The anti-fuse of claim 11, wherein the capacitor dielectric layer and the gate dielectric layer comprise one selected from the group consisting of an oxide layer, a nitride layer, an oxynitride layer, a metal oxide layer and any combination thereof.

* * * * *